(12) United States Patent
Chu

(10) Patent No.: US 8,363,483 B2
(45) Date of Patent: Jan. 29, 2013

(54) CIRCUIT FOR SUPPLYING WELL VOLTAGES IN NONVOLATILE MEMORY DEVICE

(75) Inventor: Gyo Soo Chu, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 266 days.

(21) Appl. No.: 12/826,978

(22) Filed: Jun. 30, 2010

(65) Prior Publication Data

US 2010/0329037 A1 Dec. 30, 2010

(30) Foreign Application Priority Data

Jun. 30, 2009 (KR) ........................ 10-2009-0059158

(51) Int. Cl.
*G11C 16/04* (2006.01)
(52) U.S. Cl. .......... 365/185.29; 365/185.18; 365/185.25
(58) Field of Classification Search ............. 365/185.29, 365/185.18, 185.25, 185.22, 185.03
See application file for complete search history.

(56) References Cited

U.S. PATENT DOCUMENTS 7,512,007 B2 * 3/2009 Terasawa et al. ........ 365/185.18
7,542,351 B2 * 6/2009 Choy et al. ............... 365/185.25

FOREIGN PATENT DOCUMENTS

KR 1020030002692 A 9/2003
KR 1020080052471 A 11/2008

* cited by examiner

*Primary Examiner* — David Lam
(74) *Attorney, Agent, or Firm* — William Park & Associates Ltd.

(57) ABSTRACT

A circuit for supplying well voltages in a nonvolatile memory device includes an erase voltage supply unit for supplying an erase voltage to a well in response to an erase enable signal, a discharge unit for discharging the erase voltage, supplied to the well, in response to a discharge control signal, and a negative voltage supply unit for supplying a negative voltage to the well in response to a negative voltage output enable signal.

9 Claims, 5 Drawing Sheets

CIRCUIT FOR SUPPLYING WELL VOLTAGES IN NONVOLATILE MEMORY DEVICE

CROSS-REFERENCE TO RELATED APPLICATION

Priority to Korean patent application number 10-2009-0059158 filed on Jun. 30, 2009, the entire disclosure of which is incorporated by reference herein, is claimed.

BACKGROUND

Exemplary embodiments relate generally to a nonvolatile memory device, and more particularly to a circuit for supplying well voltages in a nonvolatile memory device.

Electrically programmable and erasable nonvolatile memory devices which can retain data even without supply of power are increasingly in demand. High integration of memory cells is then necessary to develop high-capacity memory devices capable of storing a large amount of data. A nonvolatile memory device includes a number of memory cells coupled in series together to form one cell string. And a number of the cell strings form a memory cell array.

The cell string in a nonvolatile memory device has a structure in which a number of memory cells are coupled between a bit line and a source line. Because of the string structure, the number of contacts between the bit line and the source line can be reduced and so the size of a memory cell can be reduced, thereby enabling high-capacity memory devices. The above string structure, however, is disadvantageous in that the access speed is slow because the cell current of a memory cell becomes very low as the size of the memory cell is reduced.

Unlike a typical memory device, a memory cell in a non-volatile memory device can store data of 2 bits or more (i.e., a multi-level form). That is, the memory cell in a nonvolatile memory device can store data of various states by differently controlling the amount of a threshold voltage through control of the amount of charges trapped at the floating gate of the memory cell.

BRIEF SUMMARY

Exemplary embodiments relate to a circuit for supplying well voltages in a nonvolatile memory device, which is capable of reducing the current consumption of unselected memory blocks due to a negative voltage supplied to a well when the nonvolatile memory device is operated.

A circuit for supplying well voltages in a nonvolatile memory device according to an aspect of the present disclosure comprises an erase voltage supply unit for supplying an erase voltage to a well in response to an erase enable signal, a discharge unit for discharging the erase voltage, supplied to the well, in response to a discharge control signal, and a negative voltage supply unit for supplying a negative voltage to the well in response to a negative voltage output enable signal.

The erase voltage supply unit comprises an erase voltage output controller for supplying a control signal to transmit the erase voltage in response to an erase operation enable signal and a first switch for switching the erase voltage, supplied by an erase voltage pump, in response to the control signal and supplying the switched erase voltage to the well.

The discharge unit comprises second and third switches coupled between the well and a ground node and first and second discharge controllers for turning on the second and third switches, respectively, in response to first and second discharge control signals.

The negative voltage supply unit comprises a negative voltage output controller configured to output a power source voltage or the negative voltage to a first nod in response to the negative voltage output enable signal and a first transistor turned on or off in response to a voltage level of the first node. Here, the first transistor is in a turn-off state when the voltage of the first node is the negative voltage and turned on when the voltage of the first node is the power source voltage.

The first switch comprises a second transistor coupled between the well and an input terminal to which the erase voltage is inputted and a first capacitor coupled between a gate and a source of the second transistor.

The second switch comprises a third transistor coupled between the well and the ground node and a second capacitor coupled between a source and a gate of the third transistor.

The third switch comprises a fourth transistor coupled between the well and the ground node and a second capacitor coupled between a source and a gate of the fourth transistor.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
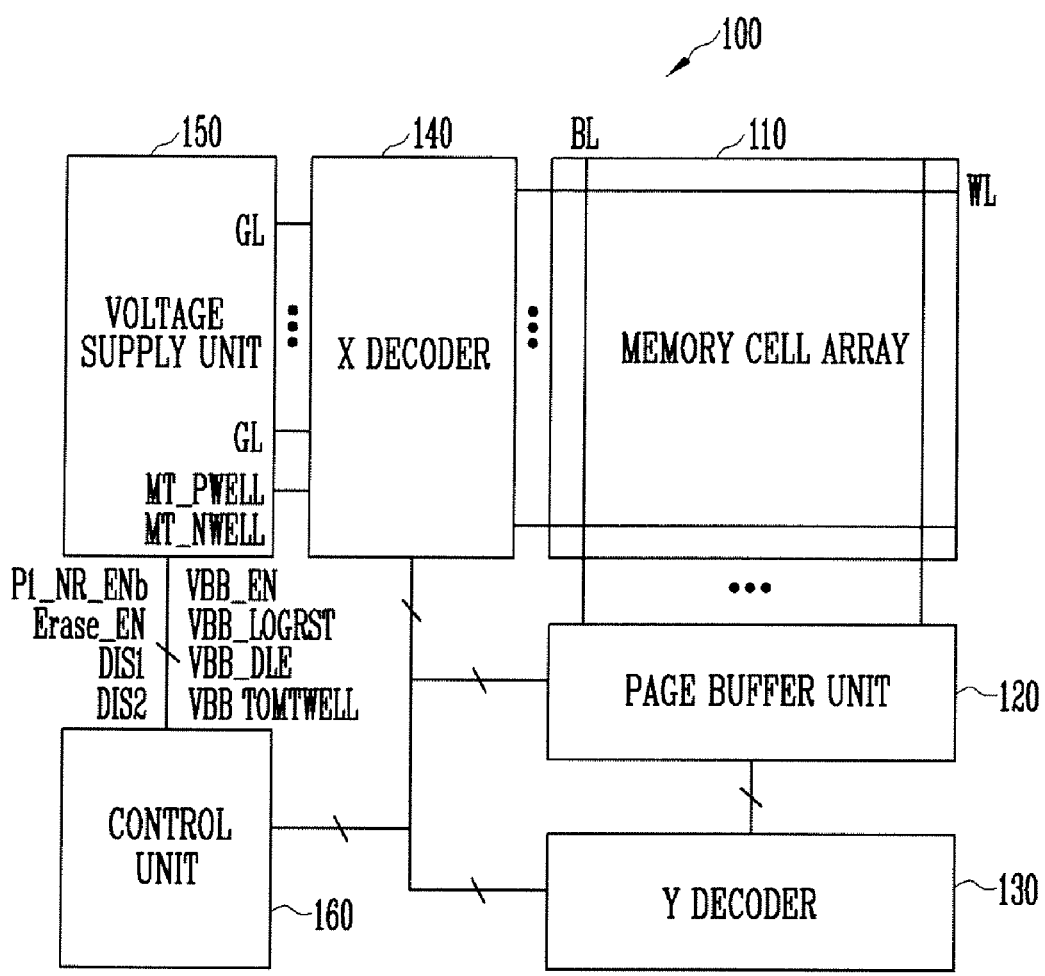
FIG. 1A is a diagram showing a nonvolatile memory device.

FIG. 1A is a diagram showing a nonvolatile memory device.

Referring to FIG. 1A, the nonvolatile memory device 100 includes a memory cell array 110, a page buffer unit 120, a Y decoder 130, an X decoder 140, a voltage supply unit 150, and a control unit 160.

Figure 1B:
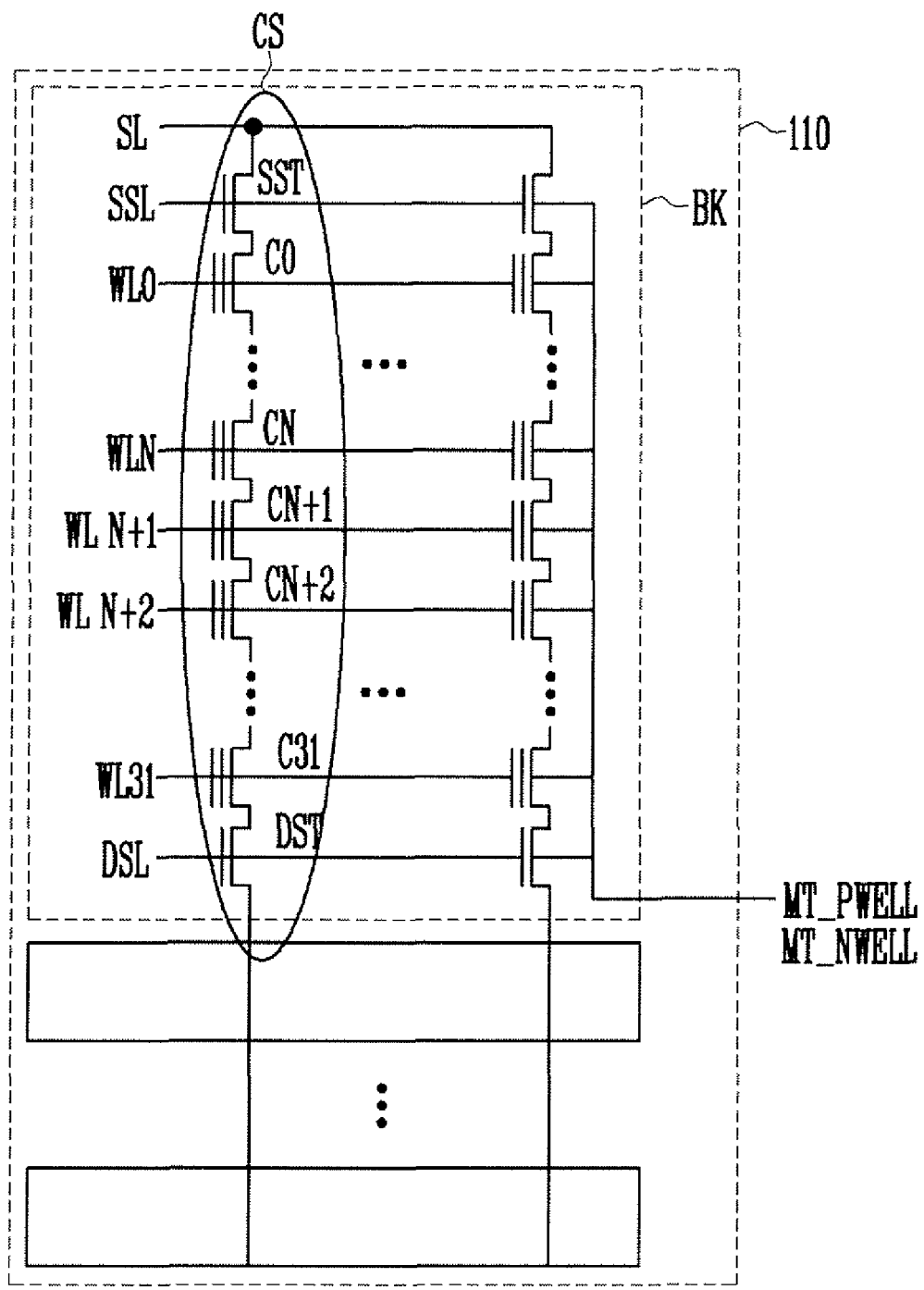
FIG. 1B is a detailed diagram showing one of the memory blocks of a memory cell array shown in FIG. 1A.

The memory cell array 110 includes a number of memory blocks BK (see FIG. 1B). Each of the memory blocks BK includes a number of memory cells coupled to bit lines BL and word lines WL. The memory cells of the nonvolatile memory device 100 according to an embodiment of this disclosure are multi-level cells (hereinafter referred to as 'MLCs') each capable of storing data of 2 bits.

Accordingly, logical pages, including a least significant bit (hereinafter referred to as a 'LSB') page and a most significant bit (hereinafter referred to as an 'MSB') page, are included in each of the word lines corresponding to a physical page.

The page buffer unit 120 includes page buffers PB, each coupled to one or more of the bit lines BL. In an embodiment of this disclosure, one page buffer PB is coupled to a pair of the bit lines BL, including an even bit line BLe and an odd bit line BLo.

The page buffer PB is used for program and data read operations and configured to perform a program verification operation according to a state of data stored in a latch.

The Y decoder 130 provides the page buffers PB with a data I/O path in response to a control signal generated by the control unit 160.

The X decoder 140 selects a word line in response to a control signal generated by the control unit 160 and couples the selected word line to global lines GL for supplying operating voltages.

The voltage supply unit 150 generates voltages for program, program verification, data read, and erase operations and supplies them to the global lines. When an erase operation is performed, the voltage supply unit 150 supplies an erase voltage to the well of a memory block. When a data read or program verification operation is performed, the voltage supply unit 150 supplies the well with well voltages MT_P-WELL, MT_NWELL.

To this end, the voltage supply unit 150 has a function of generating and supplying a negative voltage.

The control unit 160 generates control signals for program, program verification, data read, and erase operations. The control unit 160 sets up levels of the negative voltage supplied from the voltage supply unit 150 to the P-well and supplies control signals VBB_EN, VBB_LOGRST, CTLBUS, VBB_DLE, VBB TOMTWELL, P1_NR_ENb, Erase_EN, DIS1, DIS2.

The control signals VBB_EN, VBB_LOGRST, CTLBUS, and VBB_DLE are used to set up a level of the negative voltage. The control signals set up the levels of the negative voltage according to a user setting or a value stored in the control unit 160.

An erase operation enable signal Erase_EN is used to input the erase voltage. First and second discharge control signals DIS1, DIS2 are inputted when voltage supplied to the well is discharged.

The negative voltage output enable signal VBB TOMTWELL is used to input the negative voltage to the P-well. A control signal P1_NR_ENb is used to start the operation of a pump (not shown) for generating the negative voltage having a set level.

FIG. 1B is a detailed diagram showing one of the memory blocks BK of the memory cell array 110 shown in FIG. 1A.

Referring to FIG. 1B, the memory cell array 110 includes a number of the memory blocks BK. Each of the memory blocks BK includes a number of cell strings CS.

Each of the cell string CS includes first to thirty-second memory cells C0 to C31 coupled in series between a drain select transistor DST and a source select transistor SST.

The drains of the drain select transistors DST of the cell strings CS are coupled to the respective bit lines BL. The sources of the source select transistors SST of the cell strings CS are in common coupled to a source line SL.

The gates of the drain select transistors DST of the cell strings CS are in common coupled to a drain selection line DSL. The gates of the source select transistors SST are in common coupled to a source selection line SSL.

The gates of the first to thirty-second memory cells C0 to C31 are respectively coupled to first to thirty-second word lines WL0 to WL31.

The well voltage MT_PWELL or MT_NWELL is supplied to a P-well or an N-well for every memory block. The well voltages MT_PWELL, MT_PWELL are simultaneously inputted for all the memory blocks and are not related to whether they are selected or not selected for an operation.

The structure of the cell string CS coupled to one or more bit lines is described below.

Figure 1C:
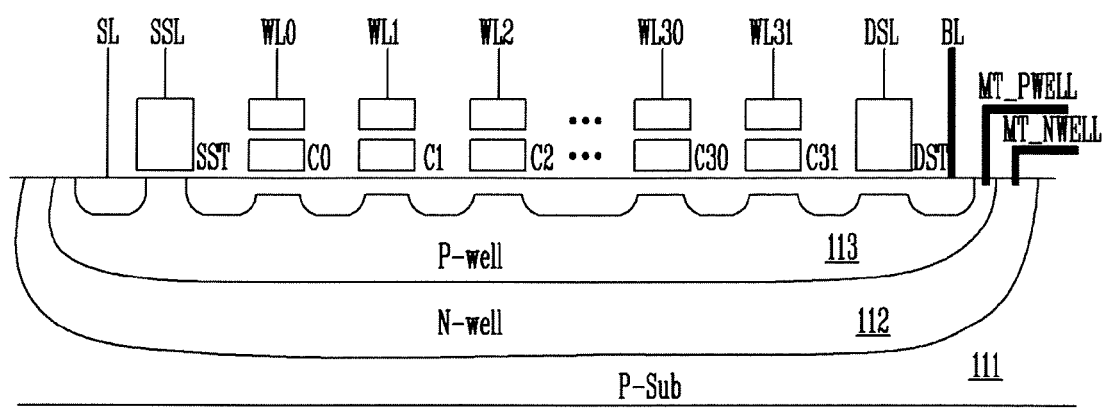
FIG. 1C is a cross-sectional view of a cell string shown in FIG. 1B.

FIG. 1C is a cross-sectional view of the cell string CS shown in FIG. 1B.

Referring to FIG. 1C, the memory block BK includes the first to thirty-second memory cells C0 to C31, the drain select transistor DST, and the source select transistor SST which are formed over a semiconductor substrate. The semiconductor substrate has a triple well structure in which an N-well 112 and a P-well 113 are formed over a substrate P-Sub 111.

The bit line BL is coupled to a junction on the drain side of the drain select transistor DST. The P-well voltage MT_P-WELL and the N-well voltage MT_NWELL are respectively supplied to the P-well 113 and the N-well 112.

In case when any of the following: a program, program verification, data read, or erase operation, is performed in the nonvolatile memory device 100, only one of the memory blocks BK is enabled and operating voltages are supplied thereto. The remaining memory blocks BK are disabled.

During the time when the program, program verification, or data read operation is performed, the nonvolatile memory device 100 according to an embodiment of this disclosure supplies the negative voltage to the P-wells 113 of all the memory block, thereby being capable of reducing a leakage current Ioff which can flow through the memory blocks.

To this end, the voltage supply unit 150 includes a circuit for supplying the erase voltage or the negative voltage to the P-well 113.

Figure 2:
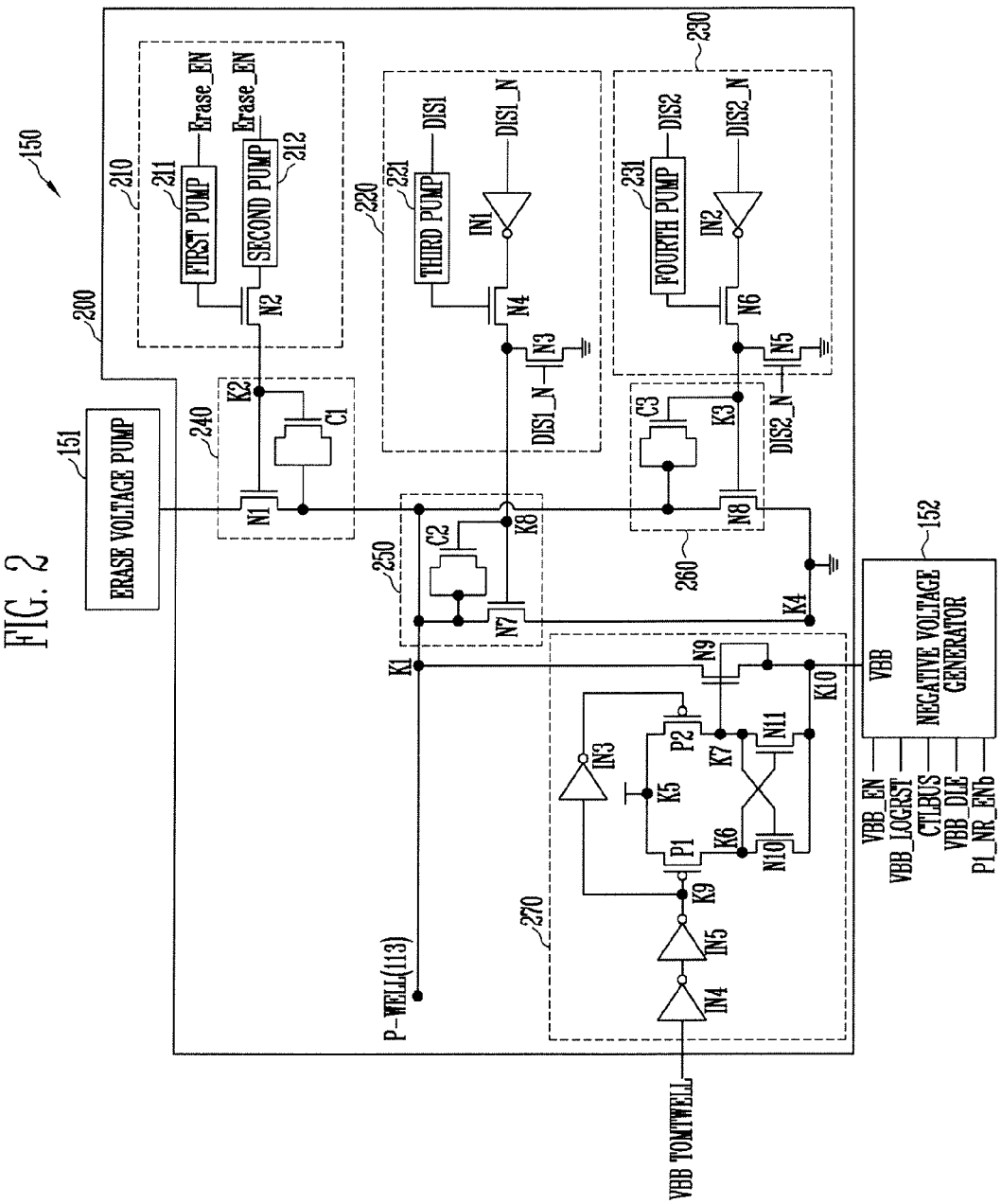
FIG. 2 shows the voltage supply circuit of the nonvolatile memory device according to an embodiment of this disclosure.

FIG. 2 shows the voltage supply circuit of the nonvolatile memory device according to an embodiment of this disclosure.

Referring to FIG. 2, the voltage supply unit 150 of the nonvolatile memory device 100 includes an erase voltage pump 151 and a negative voltage generator 152 and a circuit for supplying well voltages 200.

The erase voltage pump 151 generates the erase voltage Verase to be supplied to the P-well 113 in order to erase data stored in the memory block. The negative voltage generator 152 sets up a level of the negative voltage in response to the control signals VBB_EN, VBB_LOGRST, CTLBUS, VBB_DLE, and P1_NR_ENb and outputs a level of negative voltage. The negative voltage generated by the negative voltage generator 152 is supplied to a node K10.

The circuit for supplying well voltages 200 includes an erase voltage output controller 210, first and second discharge controllers 220, 230, first to third switches 240, 250, 260, and a negative voltage output controller 270.

The first switch 240 functions as an erase voltage supply unit for supplying the erase voltage to the P-well 113 according to the operations the erase voltage output controller 210. The second and third switches 250, 260 and the first and second discharge units 220, 230 function as a discharge unit for discharging voltage supplied to the P-well 113.

The erase voltage output controller 210 generates a control signal to output the erase voltage Verase to the P-well 113 in response to an erase operation enable signal Erase_EN. The first and second discharge controllers 220, 230 output a control signal to discharge voltage supplied to the P-well 113.

The first switch 240 is turned on or off in response to the output of the erase voltage output controller 210. When the first switch 240 is turned on, the erase voltage Verase from the erase voltage pump 151 is transferred to the P-well 113 in order to erase data stored in the memory block.

The second and third switches 250, 260 are turned on or off in response to the respective outputs of the first and second discharge controllers 220, 230. When the second and third switches 250, 260 are turned on, the P-well 113 is coupled to a ground node, and so the voltage supplied to the P-well 113 is discharged.

The negative voltage output controller 270 controls the negative voltage supplied by the negative voltage generator 152 so that a negative voltage is supplied to the P-well 113.

The erase voltage output controller 210 includes first and second pumps 211, 212 and a second NMOS transistor N2. The first discharge controller 220 includes a third pump 221, third and fourth NMOS transistors N3, N4, and a first inverter IN1.

The second discharge controller 230 includes a fourth pump 231, fifth and sixth NMOS transistors N5, N6, and a second inverter IN2.

The first switch 240 includes a first NMOS transistor N1 and a first capacitor C1. The second switch 250 includes a seventh NMOS transistor N7 and a second capacitor C2. The third switch 260 includes an eighth NMOS transistor N8 and a third capacitor C3.

Each of the first to third capacitors C1, C2, C3 is coupled to the drain and source of the NMOS transistor.

The erase voltage output controller 270 includes first and second PMOS transistors P1, P2, third to fifth inverters IN3, IN4, IN5, and ninth to eleventh NMOS transistors N9, N10, N11.

The first NMOS transistor N1 is coupled between a node K1 and the erase voltage output terminal of the erase voltage pump 151. A node K2 is coupled to the gate of the first NMOS transistor N1. The node K2 is coupled to the control signal output terminal of the erase voltage output controller 210.

The first capacitor C1 is composed of an NMOS transistor having its drain and source in common coupled to the node K1 and its gate coupled to the node K2.

The second NMOS transistor N2 is coupled between the node K2 and the second pump 212. The gate of the second NMOS transistor N2 is coupled to the first pump 211.

When the erase enable signal Erase_EN is received, the first pump 211 pumps voltage enough to turn on the second NMOS transistor N2. When the erase enable signal Erase_EN is received, the second pump 212 pumps voltage enough to turn on the first NMOS transistor N1. The erase enable signal Erase_EN is supplied by the control unit 160.

The third NMOS transistor N3 is coupled between the node K1 and the ground node. An inverted first discharge control signal DIS1_N is inputted to the gate of the third NMOS transistor N3.

The fourth NMOS transistor N4 is coupled between a node K8 and the output terminal of the first inverter IN1. The output signal of the third pump 221 is inputted to the gate of the fourth NMOS transistor N4. The first inverter IN1 inverts the inverted first discharge control signal DIS1_N and outputs the result.

The third pump 221 pumps voltage enough to turn on the fourth NMOS transistor N4 in response to a first discharge control signal DIS1 supplied by the control unit 160.

The fifth NMOS transistor N5 is coupled between a node K3 and the ground node. An inverted second discharge control signal DIS2_N is inputted to the gate of the fifth NMOS transistor N5.

The sixth NMOS transistor N6 is coupled between the node K3 and the output terminal of the second inverter IN2. The gate of the sixth NMOS transistor N6 is coupled to the output terminal of the fourth pump 231. The fourth pump 231 generates voltage enough to turn on the sixth NMOS transistor N6 by performing voltage pumping in response to a second discharge control signal DIS2 supplied by the control unit 160.

The second inverter IN2 inverts the inverted second discharge control signal DIS2_N again and outputs the result to the node K3.

The first and second discharge control signals DIS1, DIS2 are supplied when voltage supplied from the control unit 160 to the P-well 113 is discharged.

The second capacitor C2 is composed of an NMOS transistor having its drain and source in common coupled to the node K1 and its gate coupled to the node K8. The third capacitor C3 is composed of an NMOS transistor having its drain and source in common coupled to the node K1 and its gate coupled to the node K3.

The seventh NMOS transistor N7 is coupled between the node K1 and a node K4. The gate of the seventh NMOS transistor N7 is coupled to the node K8. The node K8 is coupled to the output terminal of the first discharge controller 220. The node K4 is coupled to the ground node.

The eighth NMOS transistor N8 is coupled between the node K1 and the node K4. The gate of the eighth NMOS transistor N8 is coupled to the node K3.

The ninth NMOS transistor N9 is coupled between the node K1 and the node K10. The gate of the ninth NMOS transistor N9 is coupled to a node K7. The negative voltage output by the negative voltage generator 152 is inputted to the node K10.

In particular, the ninth NMOS transistor N9, unlike a typical transistor, is turned off in response to the negative voltage and configured to maintain a turn-on state in response to a positive voltage. Accordingly, although the negative voltage is introduced into the gate of the ninth NMOS transistor N9, the ninth NMOS transistor N9 can normally maintain a turn-off state without an error.

The first PMOS transistor P1 is coupled between a node K5 and a node K6. The second PMOS transistor P2 is coupled between the node K5 and the node K7. The gate of the first PMOS transistor P1 is coupled to the node K9. The gate of the second PMOS transistor P2 is coupled to the output terminal of the third inverter IN3.

The third inverter IN3 inverts a signal level of the node K9 and outputs the result.

The fourth and fifth inverters IN4, IN5 delay the negative voltage output enable signal VBB TOMTWELL and output a delayed signal to the node K9.

The tenth NMOS transistor N10 is coupled between the node K6 and the node K10. The eleventh NMOS transistor N11 is coupled between the node K7 and the node K10. The gate of the tenth NMOS transistor N10 is coupled to the node K7. The gate of the eleventh NMOS transistor N11 is coupled to the node K6.

A power source voltage is supplied to the node K5, and the negative voltage is supplied to the node K10.

The operation of the circuit 200 is described below.

To supply the erase voltage Verase to the P-well 113, the erase voltage pump 151 generates a high voltage, e.g., an erase voltage Verase. The control unit 160 supplies the erase operation enable signal Erase_EN of a high level.

In response to the erase operation enable signal Erase_EN of a high level, the first and second pump 211, 212 performs voltage pumping. When the first pump 211 pumps and outputs voltage enough to turn on the second NMOS transistor N2, the second NMOS transistor N2 is turned on.

When the second pump 212 pumps voltage enough to turn on the first NMOS transistor N1, the first NMOS transistor N1 is turned on. When the first NMOS transistor N1 is turned on, the erase voltage Verase having a high level pumped by the erase voltage pump 151 is transferred to the node K1. The erase voltage Verase is supplied to the P-well 113 coupled to the node K1.

During the time for which the erase voltage Verase is supplied, the negative voltage output enable signal VBB TOMTWELL of a low level is inputted. Accordingly, a voltage level of the node K9 shifts to a low level, and so the first PMOS transistor P1 is turned on and the second PMOS transistor P2 is turned off.

When the first PMOS transistor P1 is turned on, the power source voltage is supplied to the node K6. When the power source voltage is supplied to the node K6, the eleventh NMOS transistor N11 is turned on. Accordingly, the node K10 is coupled to the node K7, and the negative voltage is supplied to the node K10.

As described above, when the negative voltage is supplied to the gate of the ninth NMOS transistor N9, the ninth NMOS transistor N9 maintains a turn-off state. The first and second discharge controllers 220, 230 are not operated because the first and second discharge control signals DIS1, DIS2 of a low level are received.

That is, when the first and second discharge control signals DIS1, DIS2 of a low level are received, the inverted first and second discharge control signals DIS1_N, DIS2_N are in a high level. Accordingly, the third and fifth NMOS transistors N3, N5 are turned on, and so the ground node is coupled to the nodes K8, K3. Accordingly, the erase voltage Verase inputted to the node K1 is transferred only toward the P-well 113.

After the erase operation is terminated, the erase voltage Verase supplied to the P-well 113 has to be discharged. To this end, the control unit 160 supplies the erase operation enable signal Erase_EN of a low level so that the operations of the first and second pumps 211, 212 are stopped.

When the first and second pumps 211, 212 stop operating, the first and second NMOS transistors N1, N2 are turned off, and so the erase voltage Verase is no longer supplied to the node K1.

To discharge the erase voltage Verase supplied to the P-well, the control unit 160 supplies the first and second discharge control signals DIS1, DIS2 of a high level.

In response to the first and second discharge control signals DIS1, DIS2 of a high level, the inverted first and second discharge control signals DIS1_N, DIS2_N shift to a low level. Accordingly, the third and fifth NMOS transistors N3, N5 are turned off.

The third and fourth pumps 221, 231 start to operate and pump respective voltages enough to turn on the fourth and sixth NMOS transistors N4, N6.

The first and second inverters IN1, IN2 invert the respective inverted first and second discharge control signals DIS1_N, DIS2_N and output signals of a high level.

When the fourth and the sixth NMOS transistors N4, N6 are turned on, the signals of a high level are supplied to the respective gates of the seventh and eighth NMOS transistors N7, N8. Accordingly, the seventh and eighth NMOS transistors N7, N8 are turned on, and so the node K1 is coupled to the ground node.

Since the node K1 is coupled to the P-well 113, the erase voltage Verase supplied to the P-well 113 is discharged to a ground voltage through two current paths coupled by the seventh and eighth NMOS transistors N7, N8. Here, since the negative voltage output enable signal VBB TOMTWELL still remains in a low level, the ninth NMOS transistor N9 maintains the turn-off state.

Meanwhile, in an embodiment of this disclosure, when the nonvolatile memory device is operated, the negative voltage is supplied to the P-well 113 of the memory blocks. To this end, the negative voltage generator 152 starts operating to generate the negative voltage and supply the negative voltage to the node K10.

When the negative voltage output enable signal VBB TOMTWELL shifts to a high level, a voltage level of the node K9 shifts to a high level, and so the second PMOS transistor P2 is turned on.

Accordingly, the power source voltage is supplied to the node K7, and the ninth NMOS transistor N9 is turned on.

When the ninth NMOS transistor N9 is turned on, the negative voltage supplied to the node K10 is inputted to the P-well 113 via the node K1.

The negative voltage inputted to the node K1 influences the first, seventh, and eighth NMOS transistors N1, N7, N8 coupled to the node K1.

Here, problems as described below will occur if the first to third capacitors C1, C2, C3 did not exist. A case that will present problems when the first capacitor C1 did not exist is described below as an example.

Figure 3A:
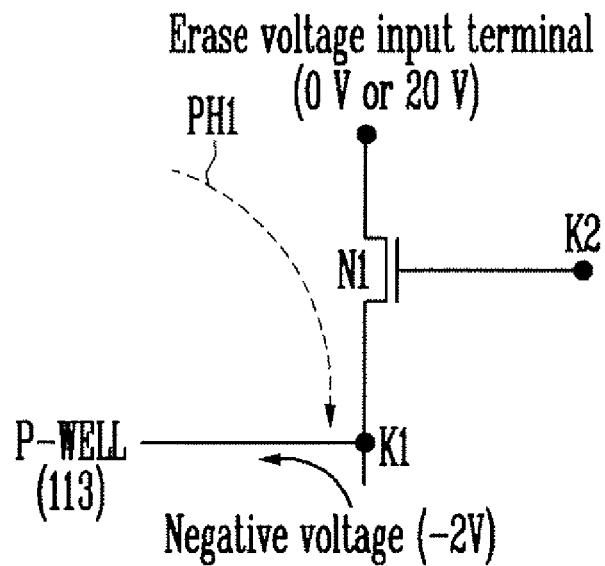
FIG. 3A is a circuit diagram illustrating an operation when a first capacitor is not included in a first switch shown in FIG. 2.

FIG. 3A is a circuit diagram illustrating an operation when the first capacitor C1 did not exist in the first switch 240 shown in FIG. 2.

Referring to FIG. 3A, if the first switch 240 included only the first NMOS transistor N1 without the first capacitor C1, the negative voltage of about −2 V will be supplied to the node K1 when the negative voltage is supplied to the P-well 113.

Here, since the erase voltage Verase has not been supplied, the erase voltage input terminal maintains 0 V, and the node K2 also maintains 0 V. Consequently, a gate-source voltage Vgs becomes −2 V. Accordingly, PN tunneling is generated in a path direction PH1 as shown in FIG. 3A, and the negative voltage of the node K1 may be introduced into the erase voltage input terminal.

For the above reason, the first switch 240 of the circuit for supplying well voltages 200 according to an embodiment of this disclosure further includes the first capacitor C1.

Figure 3B:
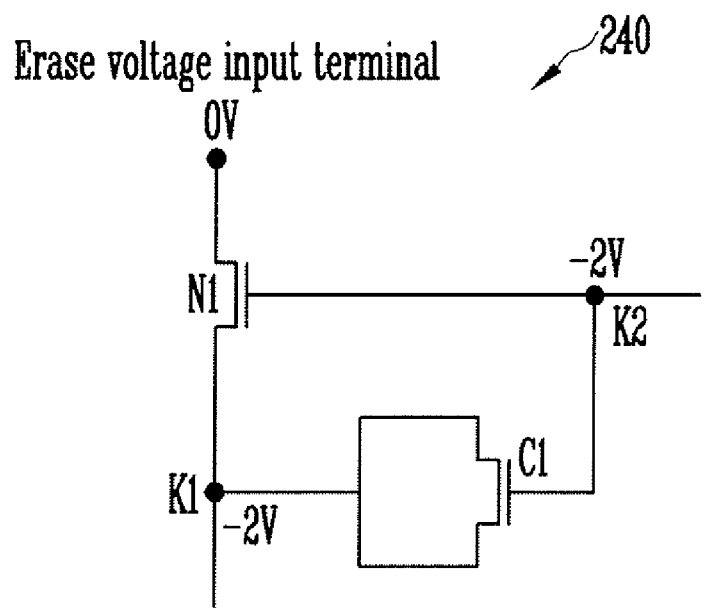
FIG. 3B is a circuit diagram of the first switch of FIG. 3A.

FIG. 3B is a circuit diagram of the first switch 240 utilizing the first capacitor C1 that will prevent the problems described above with respect to FIG. 3A.

Referring to FIG. 3B, when the first switch 240 supplies the negative voltage of about −2 V to the node K1, the first capacitor C1 is precharged to the negative voltage. Accordingly, the node K2 also has the negative voltage level of about −2 V.

Consequently, the gate-source voltage Vgs becomes 0 V, and PN tunneling of the first NMOS transistor N1 is not generated, thereby preventing the negative voltage from introducing into the erase voltage input terminal.

As described above, in the circuit for supplying well voltages in the nonvolatile memory device according to embodiments of this disclosure, when a data read or verification operation is performed, a negative voltage is supplied to the well. Accordingly, the leakage current of unselected memory blocks can be reduced and damage to the elements of the voltage supply circuit resulting from the negative voltage can be prevented.

What is claimed is:
1. A circuit for supplying well voltages in a nonvolatile memory device, the circuit comprising:
an erase voltage supply unit configured to supply an erase voltage to a well in response to an erase enable signal;
a discharge unit configured to discharge the erase voltage supplied to the well in response to a discharge control signal; and a negative voltage supply unit configured to supply a negative voltage to the well in response to a negative voltage output enable signal, wherein the erase voltage supply unit comprises:
an erase voltage output controller configured to supply a control signal to transmit the erase voltage in response to the erase operation enable signal, and
a first switch configured to switch the erase voltage supplied by an erase voltage pump in response to the control signal and supplying the switched erase voltage to the well.

2. The circuit of claim 1, wherein the discharge unit comprises:
a second switch coupled between the well and a ground node, and a first discharge controller configured to turn on the second switch in response to a first discharge control signal.

3. The circuit of claim 2, wherein the negative voltage supply unit comprises:
a negative voltage output controller configured to output a power source voltage or the negative voltage to a first node in response to the negative voltage output enable signal; and
a first transistor coupled between the first node and the well and turned on or off in response to a voltage level of the first node,
wherein the first transistor is in a turn-off state when the voltage of the first node is the negative voltage and in a turn-on state when the voltage of the first node is the power source voltage.

4. The circuit of claim 3, wherein the first switch comprises:
a second transistor coupled between the well and an input terminal to which the erase voltage is inputted and turned on or off in response to the control signal for transmitting the erase voltage, and
a first capacitor coupled between a gate and a source of the second transistor.

5. The circuit of claim 3, wherein the second switch comprises:
a third transistor coupled between the well and the ground node and turned on or off in response to a control of the first discharge controller, and
a second capacitor coupled between a source and a gate of the third transistor.

6. The circuit of claim 3, wherein the discharge unit further comprises:
a third switch coupled between the well and the ground node, and
a second discharge controller configured to turn on the third switch in response to a second discharge control signal.

7. The circuit of claim 6, wherein the third switch comprises:
a fourth transistor coupled between the well and the ground node and turn on or off in response to a control of the second discharge controller, and
a second capacitor coupled between a source and a gate of the fourth transistor.

8. A circuit for supplying well voltages, wherein the circuit is configured to supply an erase voltage to a well for an erase operation, discharge the erase voltage supplied to the well after the erase operation, supply a negative voltage to the well while the erase operation is not performed, and block an input of the negative voltage to a circuit for discharging the erase voltage and supplying the erase voltage to the well.

9. The circuit of claim 8, comprising:
a first transistor transferring the erase voltage to the well; a second transistor connecting the well and a ground node in order to discharge the erase voltage; and a coupling capacitor supplying the negative voltage to gates of the transistors in order to prevent the negative voltage from passing through the first and second transistors.

* * * * *